(12) United States Patent
Schmid et al.

(10) Patent No.: US 11,531,254 B2
(45) Date of Patent: Dec. 20, 2022

(54) PROJECTOR AND METHOD OF PROJECTING AN IMAGE

(71) Applicant: TriLite Technologies GmbH, Vienna (AT)

(72) Inventors: Gerhard Schmid, Vienna (AT); Joerg Reitterer, Brunn am Gebirge (AT); Aart Verhoef, College Station, TX (US)

(73) Assignee: TriLite Technologies GmbH, Vienna (AT)

( * ) Notice: Subject to any disclaimer, the term of this patent is extended or adjusted under 35 U.S.C. 154(b) by 104 days.

(21) Appl. No.: 17/220,122

(22) Filed: Apr. 1, 2021

(65) Prior Publication Data

US 2021/0311378 A1 Oct. 7, 2021

(30) Foreign Application Priority Data

Apr. 2, 2020 (EP) ..................... 20167744

(51) Int. Cl.
| | |
|---|---|
| *G03B 21/00* | (2006.01) |
| *B81B 3/00* | (2006.01) |
| *G03B 21/20* | (2006.01) |
| *G03B 21/56* | (2006.01) |

(52) U.S. Cl.
CPC .......... *G03B 21/008* (2013.01); *B81B 3/0083* (2013.01); *G03B 21/2033* (2013.01); *G03B 21/56* (2013.01); *B81B 2201/042* (2013.01)

(58) Field of Classification Search
CPC .... G03B 21/006; G03B 21/008; G03B 21/28; G03B 21/56; G03B 21/562; G03B 21/2013; G03B 21/2033; G03B 21/2053; G02B 26/10; G02B 26/12; G02B 26/101; G02B 26/105; G02B 26/0833; G02B 26/085; H04N 9/3129; H04N 9/3135; H04N 9/3185; H04N 9/3188; H04N 9/3161;

(Continued)

(56) References Cited

U.S. PATENT DOCUMENTS

| | | | |
|---|---|---|---|
| 9,686,519 B2* | 6/2017 | Reitterer | ............ H04N 9/3185 |
| 11,315,327 B1* | 4/2022 | Seiler | ................. G06V 20/20 |
| 2004/0119004 A1 | 6/2004 | Wine et al. | |

(Continued)

OTHER PUBLICATIONS

Extended European Search Report in corresponding European Patent Application No. 20 167 744.0, dated Oct. 5, 2020.

*Primary Examiner* — Sultan Chowdhury
(74) *Attorney, Agent, or Firm* — Hoffmann and Baron, LLP

(57) ABSTRACT

The disclosed subject matter relates to a method of projecting an image by means of a light source emitting light pulses and an oscillating micro-electro-mechanical system (MEMS) mirror deflecting the emitted light pulses, comprising: providing a matrix of durations for each pixel, and incrementing or decrementing a pixel index whenever a respective duration indexed by the respective pixel indices in the playout matrix has lapsed; for each light pulse: retrieving the respective intensity and durations indexed by the current pixel indices, calculating an interval from at least one of said durations, emitting said light pulse with said retrieved intensity, and waiting said calculated interval before emitting the next light pulse. The disclosed subject matter further relates to a projector carrying out said method.

16 Claims, 6 Drawing Sheets

Figure 1:
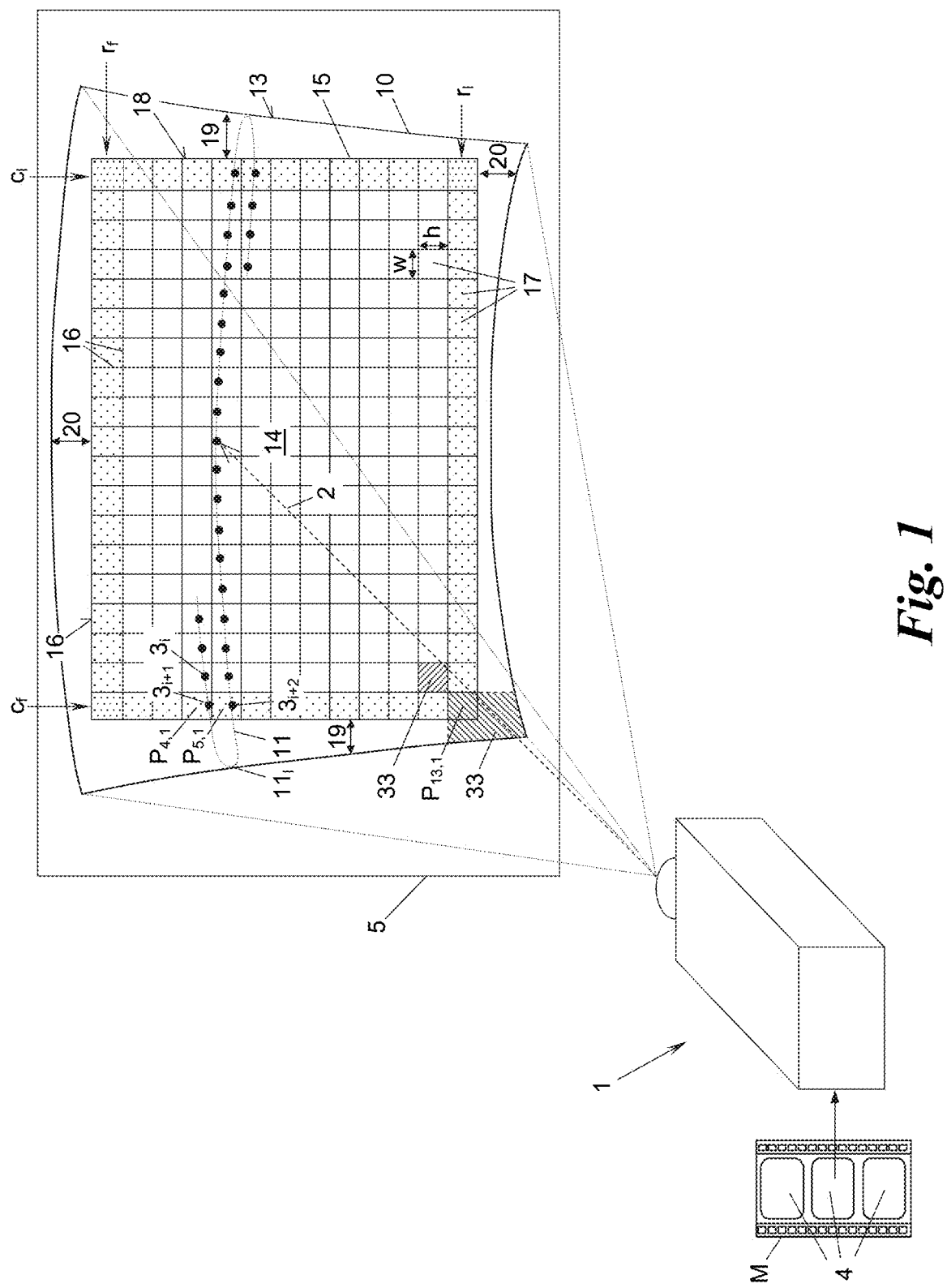

(58) Field of Classification Search
CPC .. H04N 9/3197; B81B 3/0035; B81B 3/0083; B81B 3/0086; B81B 3/0094
See application file for complete search history.

(56) References Cited

U.S. PATENT DOCUMENTS

| | | |
|---|---|---|
| 2007/0279722 A1 | 12/2007 | Yavid et al. |
| 2013/0016413 A1* | 1/2013 | Saeedi ............... G02B 27/0093 359/205.1 |
| 2014/0126590 A1 | 5/2014 | Kimura |
| 2017/0054958 A1 | 2/2017 | Naftali et al. |

* cited by examiner

PROJECTOR AND METHOD OF PROJECTING AN IMAGE

CROSS-REFERENCE TO RELATED APPLICATION/S

This application claims priority to the European Patent Application No. 20 167 744.0 filed Apr. 2, 2020, the disclosure of which is incorporated herein by reference.

TECHNICAL FIELD

The disclosed subject matter relates to a method of projecting an image provided as a matrix of pixels with intensities onto a projection area by means of a light source emitting a train of light pulses with variable intensities and intervals, and by means of a micro-electro-mechanical system (MEMS) mirror oscillating about a horizontal axis with a horizontal oscillation period and about a vertical axis with a vertical oscillation period and deflecting the emitted light pulses. The disclosed subject matter further relates to a projector carrying out said method.

BACKGROUND ART

Methods of the above-mentioned kind may be used for projecting an image onto any surface, such as a wall, a board, a projection screen, the retina of an eye, or the like and have multiple applications, e.g., in large scale projectors for cinematic or public display, mid-scale projectors for business or home use, or miniature projectors in cell phones, head-up displays, virtual or augmented reality glasses, etc.

However, such an image projection usually suffers from a variety of optical aberrations: Due to the non-linear velocity of the oscillating MEMS mirror, constant intervals in the train of light pulses result in unequal distances between the projected pixels. Keystone and pincushion distortions arise depending on the orientation of the MEMS mirror with respect to the surface of projection and the curvature thereof. Mechanical interdependencies of the oscillations about the horizontal and vertical oscillation axes are another source of geometric distortions. Last but not least, slower velocities of the MEMS mirror at the turning points of the oscillation result in more pixels projected at the image boundaries which thus appear brighter than the centre of the image.

One approach to mitigate these aberrations is to control the oscillation of the MEMS mirror as, e.g., shown in U.S. Pat. No. 10,218,951 B2 where a keystone distortion is corrected by controlling the horizontal start and end positions of the oscillating MEMS mirror depending on its vertical position.

Another approach for aberration mitigation is to control the emission of the light source which is typically more responsive than the oscillating MEMS mirror and, hence, easier and faster to control. In U.S. Pat. No. 9,462,245 B2 distorted scan lines on a projection plane are parameterized, recalculated within the oscillation cycle and projected inside an undistorted image projection area within the projection plane. In U.S. Pat. No. 9,769,444 B2 the projection of an image is corrected by operating a laser using a predetermined timestamp matrix indicating the time of each pixel within the mirror oscillation period and a pixel-duration matrix indicating a laser on-time for the respective pixel.

All these prior art methods are based on an exactly reproducible trajectory of a light beam on the projection area, i.e., a reproducible sequence of pixel indices and corresponding durations, and require a MEMS mirror oscillation that is precisely controlled and whose oscillations about different axes are perfectly synchronised. However, these conditions are hardly ever met. Especially over a longer period in time, mirror parameters, such as the horizontal and vertical oscillation periods of the mirror, slightly change and a perfect synchronization of the horizontal and vertical oscillation axes is lost. This results in an imprecise reconstruction of the trajectory by the predetermined pixel durations and, thus, in a distorted and fuzzy image. A recalculation or recalibration of the trajectory in real time is cumbersome and often infeasible as all the pixel durations may have to be changed.

BRIEF SUMMARY

Summing up, there is still room for improvement for projections of the above-identified kind. It is an object of the disclosed subject matter to overcome the shortcomings of the prior art and to provide a fast and precise projection of an image which is robust against slight changes in the mirror parameters.

To this end, in a first aspect the disclosed subject matter provides for a method of projecting an image provided as a matrix of pixels with intensities onto a projection area by means of a light source emitting a train of light pulses with variable intensities and intervals and a micro-electro-mechanical system, MEMS, mirror oscillating about a horizontal axis with a horizontal oscillation period and about a vertical axis with a vertical oscillation period and deflecting the emitted light pulses, the method comprising: providing a playout matrix of a horizontal and a vertical duration for each pixel, and for a first half of every horizontal oscillation period, incrementing, and for a second half of every horizontal oscillation period, decrementing a horizontal pixel index whenever one of the horizontal durations indexed by the current horizontal pixel index in the playout matrix has lapsed; for a first half of every vertical oscillation period, incrementing, and for a second half of every vertical oscillation period, decrementing a vertical pixel index whenever one of the vertical durations indexed by the current vertical pixel index in the playout matrix has lapsed; for each light pulse in the train: retrieving the respective intensity from the pixel matrix indexed by the current horizontal and vertical pixel indices, retrieving the respective horizontal and vertical durations from the playout matrix indexed by the current horizontal and vertical pixel indices, calculating an interval from at least one of said respective horizontal and vertical durations, emitting said light pulse with said retrieved intensity, and waiting said calculated interval before emitting the next light pulse in the train.

In the present disclosure, the term "MEMS mirror oscillating about a horizontal and a vertical axis" comprises either one reflective surface oscillating about two axes or two reflective surfaces each oscillating about a single axis. Similarly, the term "playout matrix of a horizontal and a vertical duration for each pixel" comprises either a single matrix holding doublets of a vertical and a horizontal duration for each pixel or two matrices each holding the respective horizontal or vertical durations for all pixels.

The horizontal and vertical durations in the playout matrix each represent a time span within the respective mirror oscillation period a light pulse is deflected both horizontally and vertically to a region in the projection area corresponding to a pixel. The playout matrix can thus also be seen as a vector field of reciprocal values of local horizontal and vertical velocities of the light beam which can be used to reproduce the trajectory of the light beam on the projection area with great accuracy.

The playout matrix and its use in the projection method and apparatus of the disclosed subject matter has multiple benefits. Firstly, the horizontal and vertical durations in the playout matrix can parameterize any arbitrary trajectory of deflected light pulses on the projection area given a starting position of the trajectory, e.g., a starting mirror position or pixel index. Incrementing and decrementing the pixel indices whenever a respective duration has lapsed allows to precisely follow the oscillation of the MEMS mirror and, hence, the trajectory of the light beam on the projection area in real time.

Secondly, knowing the current pixel indices enables a fast retrieval of the respective intensity from the pixel matrix and a subsequent calculation of the interval between two light pulses. The corresponding intensities and durations can be retrieved fast in a random access manner. Thereby, the emission of the light source can be precisely controlled in real time, i.e., synchronized to the MEMS mirror oscillation.

Thirdly, no synchronisation between the horizontal and the vertical oscillation axis for the precise reproduction of a trajectory is needed. Instead, one single synchronization signal per oscillation axis indicating a mirror position or starting pixel indices suffices for the determination of the trajectory.

Fourthly, the disclosed method is robust against a misalignment of the oscillation axes or a slight change in the oscillation period about an oscillation axis. For example, a pixel in said image area crossed only by parts of the beam of light pulses, e.g., in a corner, would be assigned a single duration in a conventional pixel-duration matrix such as described in U.S. Pat. No. 9,769,444 B2. If, however, the trajectory slightly changes such that the pixel is not crossed in its full width or full height, the assigned single duration were wrong. In contrast thereto, in the disclosed method the knowledge about both the horizontal and vertical durations of the pixels allows to correctly take into account any changes of the trajectory caused by oscillation changes in both the horizontal and vertical directions.

Last but not least, optical aberrations can be compensated by providing "appropriate" durations in the playout matrix. Geometric distortions can be compensated by assigning longer durations to boundary pixels, to project an equidistant grid of pixels.

The disclosed method is especially suited to be carried out by a processor connected to a first memory storing the matrix of pixels with their intensities and a second memory storing the playout matrix. Since the playout matrix comprises a lot of data, a fast retrieval of the durations therefrom is crucial to enable a real time determination of the light pulse intervals and intensities. The requirements on the second memory are very tough and only fulfilled by expensive and/or power consuming memory hardware.

Applicants have found that the oscillatory movement of the MEMS mirror leads to certain favourable properties of the playout matrix which can be exploited for storing the playout matrix in a very memory efficient way.

To this end, in an embodiment of the disclosed method the playout matrix is decomposed into a pair of floor values common to all elements of the playout matrix, a residual vector comprised of first residual values for horizontal and/or vertical durations common to all rows or columns of the playout matrix, and a residual matrix comprised of second residual values for horizontal and/or vertical durations, wherein each second residual value is provided with a shorter bit length than the floor or first residual values, and wherein said retrieving of the respective horizontal and vertical durations is made by combining the floor values with the respective first and second residual values indexed by the current horizontal and vertical pixel indices.

This decomposition reduces the magnitude of the second residual values so that they can be stored very efficiently with a short bit length. A playout matrix whose values were represented by eight bits can, e.g., be decomposed into floor values with eight bits, first residual values with four bits and second residual values with only one or two bits.

The reduced memory requirements of the playout matrix allow the use of small and fast on board or processor internal memory, e.g., block RAM, SRAM, etc., of course also in combination with internal processor caches when needed. The corresponding fast retrieval of the respective durations from the playout matrix enables a real time calculation of the current pixel indices, e.g. within one clock cycle, and, thus, a precise control of the light source's emission. Or, seen from another perspective, the reduced storage space and faster memory allow to project pictures of a higher resolution in real time.

The above-mentioned different "and/or" variants of decomposing the playout matrix into floor, first and second residual values allow for different levels of storage reduction, for example: i) In many cases, only a horizontal calibration of a projection is sufficient and the vertical durations of the playout matrix may thus be represented by a single floor value which is then oversampled to the full resolution of the playout matrix, i.e., used for every pixel, whereas the horizontal durations of the playout matrix are provided as a floor, first and second residual values; ii) a full horizontal and partial vertical calibration can be implemented by providing the vertical durations of the playout matrix as a floor value and a residual vector which are then oversampled to the full resolution of the playout matrix whereas the horizontal durations of the playout matrix are provided as a floor, first and second residual values; iii) for a full horizontal and full vertical calibration, the horizontal and vertical durations of the playout matrix are both decomposed into respective floor, first and second residual values. i) and ii) are, of course, applicable mutatis mutandis when only vertical calibration with no or only a partial horizontal compensation is sought.

The smaller the dynamic range of the horizontal and vertical durations, respectively, in the playout matrix, the more memory can be saved by the above-mentioned decomposition. However, often the projection area is distorted, e.g., exhibits a keystone or pincushion distortion. Then, the projection of the image as an equidistant pixel grid would require particularly long durations in the playout matrix for the boundary pixels of the grid. Such long durations increase the dynamics of the playout matrix and result either in an imperfect representation of the playout matrix when decomposed or very little memory savings.

Therefore, in an advantageous embodiment at least a part of the horizontal durations in the first and last columns of the playout matrix is provided, instead of in the playout matrix, in at least one horizontal offset vector which is used in calculating the intervals for the pixels in said first and last columns. The term "part of the horizontal durations" actually comprises several variants, i.e., that a part of the first and last columns is provided in the offset vector and/or that a part of each respective duration is provided in the offset vector.

In all the these variants the dynamics of the playout matrix is reduced and the second residual values can be represented in the shortest bit length possible to save memory. Optionally, both a left and a right offset vector are used and retrieved when horizontal durations of the first or last column of the playout matrix are required. The durations in the first and last columns then also represent (reciprocally) the local velocities of the deflected light pulses in the projection area, and the left and right offset vectors represent the time offsets of the first and last column pixels within the respective half oscillation periods.

Analogously, at least a part of the vertical durations in the first and last rows of the playout matrix may be provided, instead of in the playout matrix, in at least one vertical offset vector which is used in calculating the intervals for the pixels in said first and last rows. For the vertical offset vectors the same advantages as for horizontal offset vectors apply. Optionally, both a top and a bottom offset vector are used and retrieved when vertical durations of the first or last row of the playout matrix are required. The durations in the first and last row then also represent (reciprocally) the local velocities of the deflected light pulses in the projection area, and the top and bottom offset vectors represent the time offsets of the first and last column pixels within the respective half oscillation periods.

Applicants have further found that neighbouring values in the residual vector usually are very similar. Therefore, a further memory reduction can be achieved when each first residual value is stored as an increment with respect to a neighbouring first residual value in the residual vector. Such increments can be stored with a short bit length of, e.g., only one, two or four bits.

Similarly, given a sufficiently "smooth" playout matrix, i.e., with a slow dynamics, each second residual value can be stored as an increment with respect to a neighbouring second residual value in the residual matrix.

In general, the horizontal pixel index may be incremented or decremented whenever any of the horizontal durations indexed by the current horizontal pixel index has lapsed, e.g., that horizontal duration that was indexed by the vertical pixel index immediately after the last column change. Likewise, the vertical pixel index may be incremented whenever any vertical duration indexed by the current vertical pixel index has lapsed, e.g., that vertical duration that was indexed by the horizontal pixel index immediately after the last row change. However, in a further embodiment the horizontal pixel index is incremented, or decremented, respectively whenever the horizontal duration indexed by the current horizontal and vertical pixel indices in the playout matrix has lapsed, and the vertical pixel index is incremented, or decremented, respectively, whenever the vertical duration indexed by the current horizontal and vertical pixel indices in the playout matrix has lapsed. This results in the current pixel indices most accurately representing the movement of the MEMS mirror and in a particular regular projection of the pixels of the image.

In another embodiment of the disclosed subject matter the playout matrix is stored in a lower pixel resolution than the pixel matrix and, when indexing the horizontal or vertical duration, is oversampled to the resolution of the pixel matrix. In this way memory requirements are further reduced. Similarly, in a favourable embodiment the playout matrix may be stored in a memory saving format by exploiting a symmetry of the playout matrix.

Up to now, the method was described for a light source emitting one train of light pulses, e.g., to project a black and white or greyscale image. In a further embodiment, however, a colour image is projected, in that the image is provided as a matrix of pixels with intensities for two or more colours, e.g., the colours red, green and blue, wherein the light source comprises for each of said colours a laser emitting a train of light pulses of the respective colour with variable intensities and intervals, and the MEMS mirror deflects the emitted light pulses of each of said colours, and the steps of providing, incrementing, retrieving, calculating, emitting and waiting are performed separately for each of said colours. In the case of different, slightly diverging projection areas of the different lasers, the light pulses of each colour may be projected in the area of common intersection of the three projection areas by providing appropriate durations and/or offset vectors in the respective playout matrices.

In a second aspect, the disclosed subject matter provides for a projector, comprising a first memory for providing an image as a matrix of pixels with intensities, a light source configured to emit a train of light pulses with variable intensities and interval, a MEMS mirror configured to oscillate about a horizontal axis with a horizontal oscillation period and about a vertical axis with a vertical oscillation period and to deflect the emitted light pulses onto a projection area, a second memory containing a playout matrix of a horizontal and a vertical duration for each pixel, and a processor connected to the first memory, the light source, the MEMS mirror, and the second memory, wherein the processor is configured to for a first half of every horizontal oscillation period, increment, and for a second half of every horizontal oscillation period, decrement a horizontal pixel index whenever one of the horizontal durations indexed by the current horizontal pixel index in the playout matrix has lapsed, and for a first half of every vertical oscillation period, increment, and for a second half of every vertical oscillation period, decrement a vertical pixel index whenever one of the vertical durations indexed by the current vertical pixel index in the playout matrix has lapsed, and for each light pulse in the train: retrieve the respective intensity from the pixel matrix indexed by the current horizontal and vertical pixel indices, retrieve the respective horizontal and vertical durations from the playout matrix indexed by the current horizontal and vertical pixel indices, calculate an interval from at least one of the respective horizontal and vertical durations, emit said light pulse via the light source with said retrieved intensity, and wait said calculated interval before emitting the next light pulse in the train.

Concerning the advantages and further features of the disclosed projector reference is made to the above description of the disclosed method, which is carried out by the projector.

BRIEF DESCRIPTION OF THE DRAWINGS/FIGURES

Figure 2:
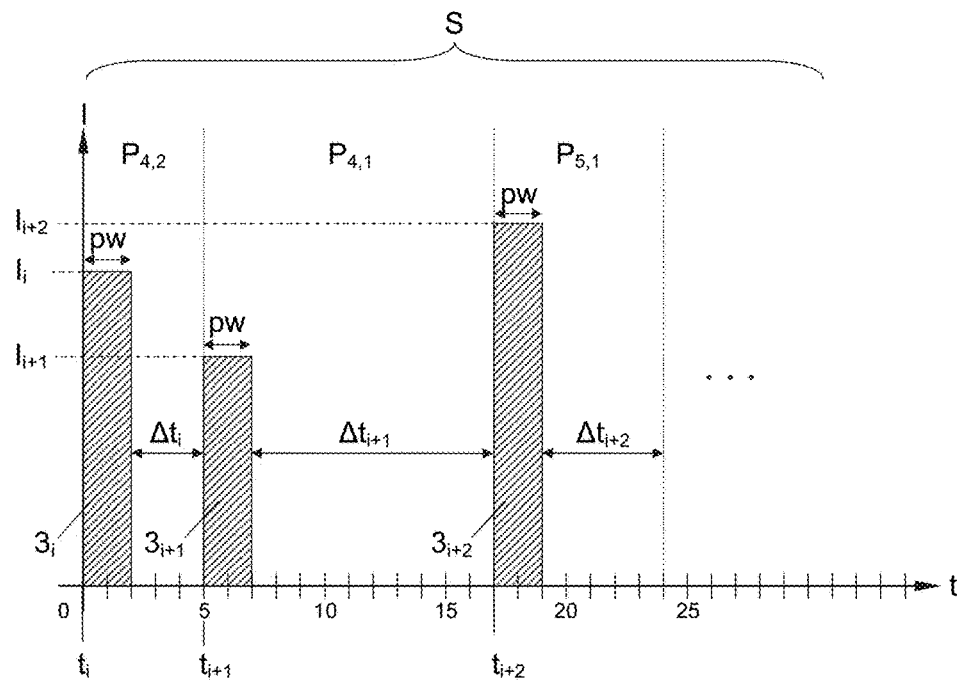
Figure 3:
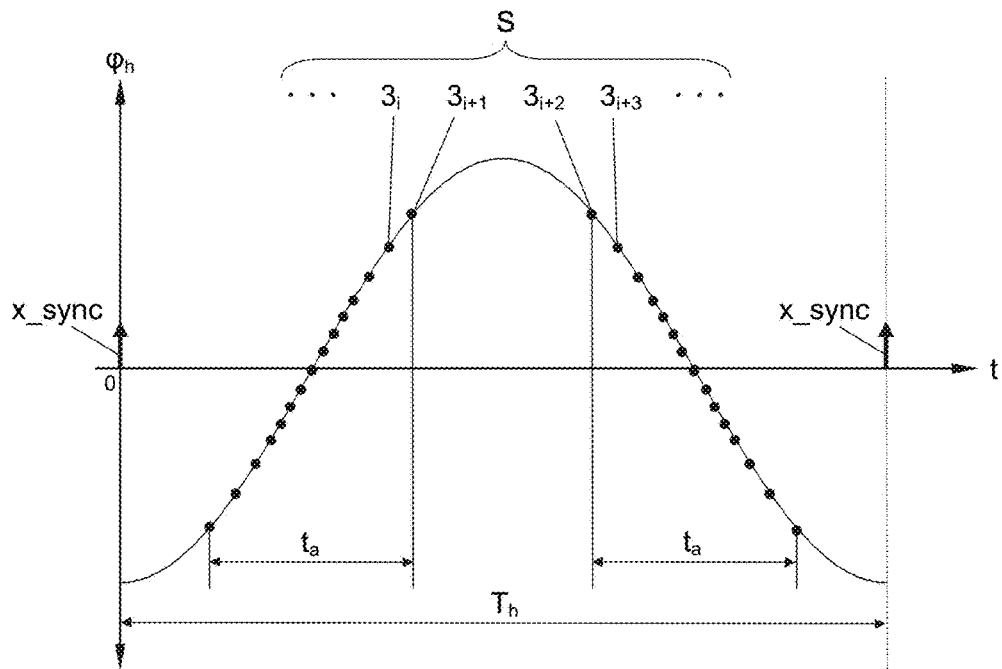
Figure 4:
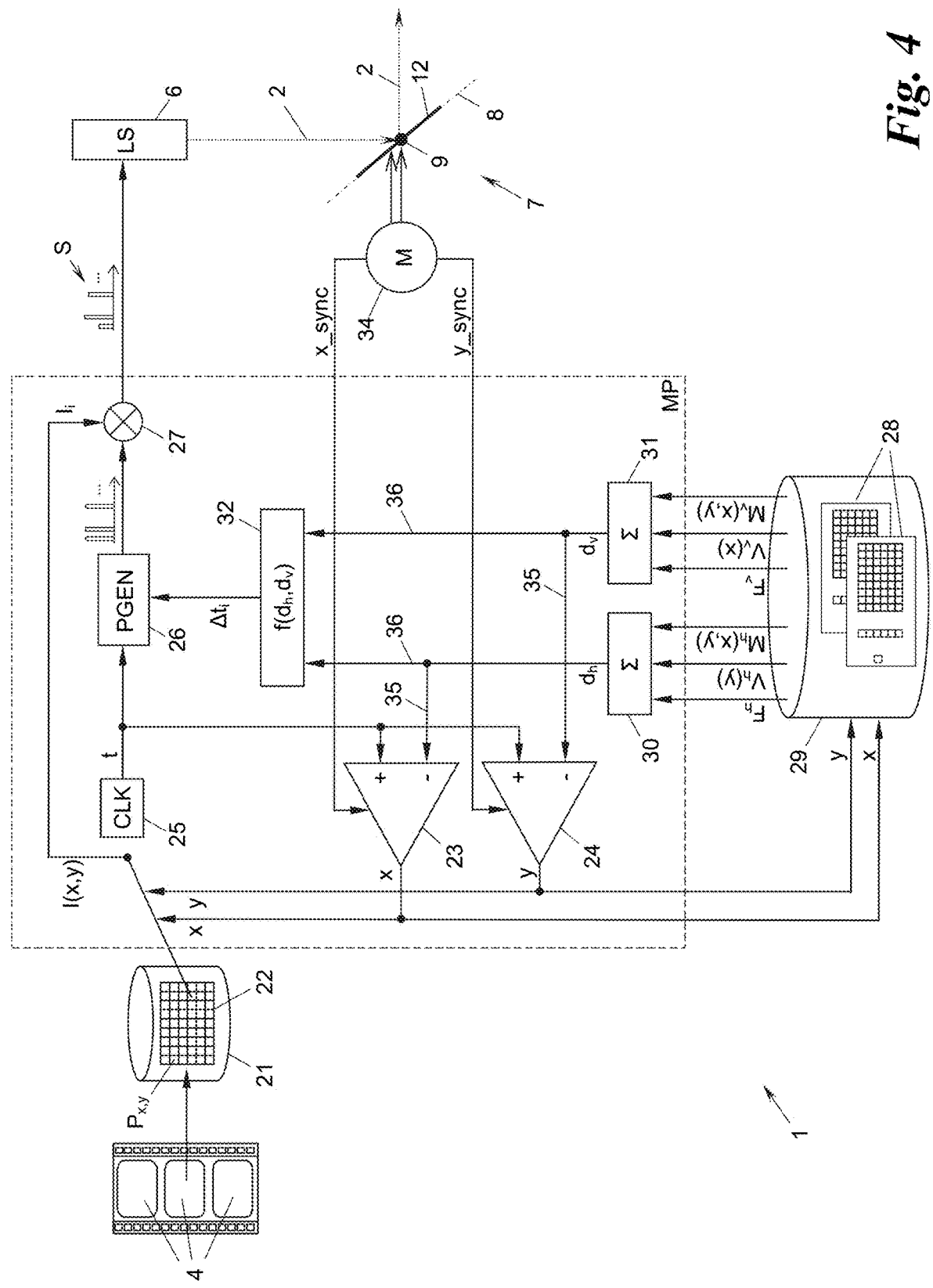
Figure 5A:
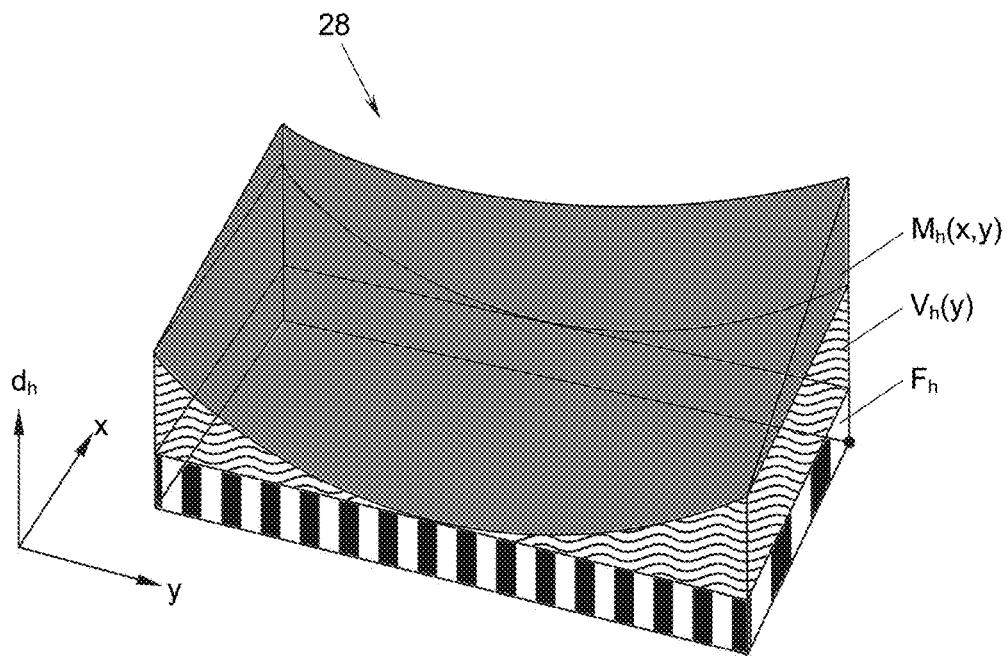
Figure 5B:
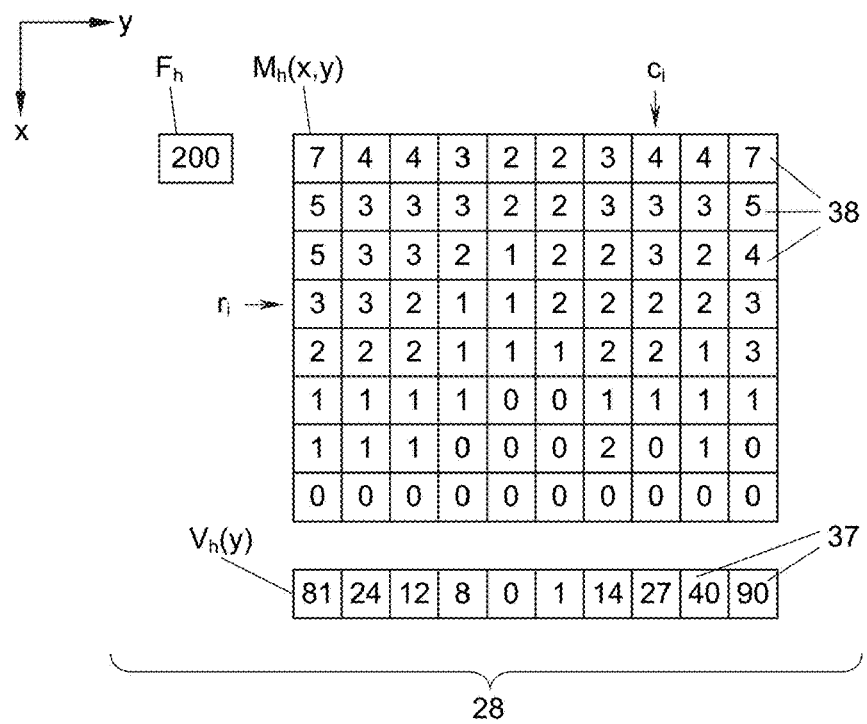
Figure 6:
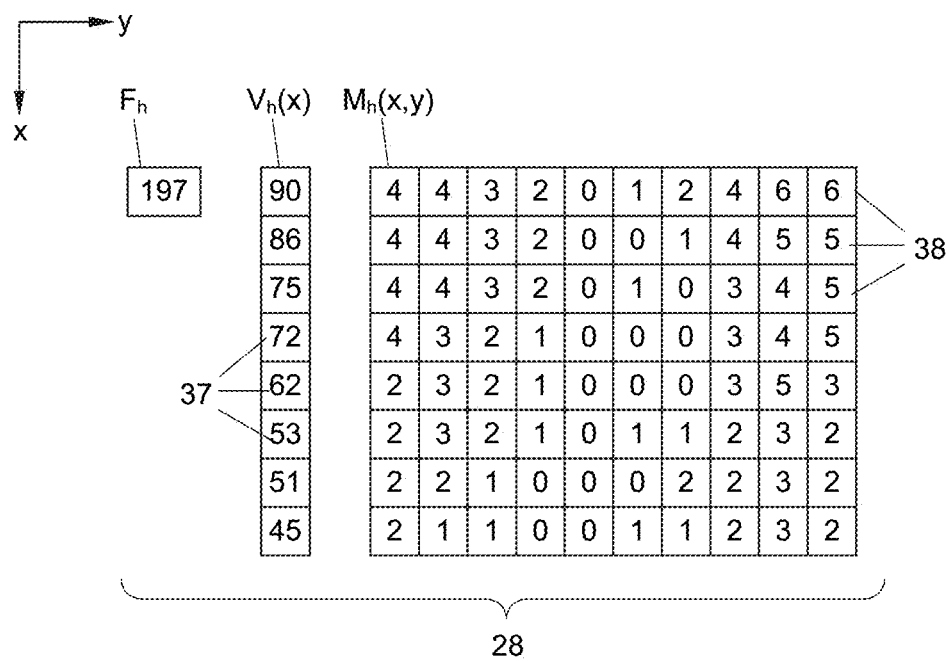
Figure 7:
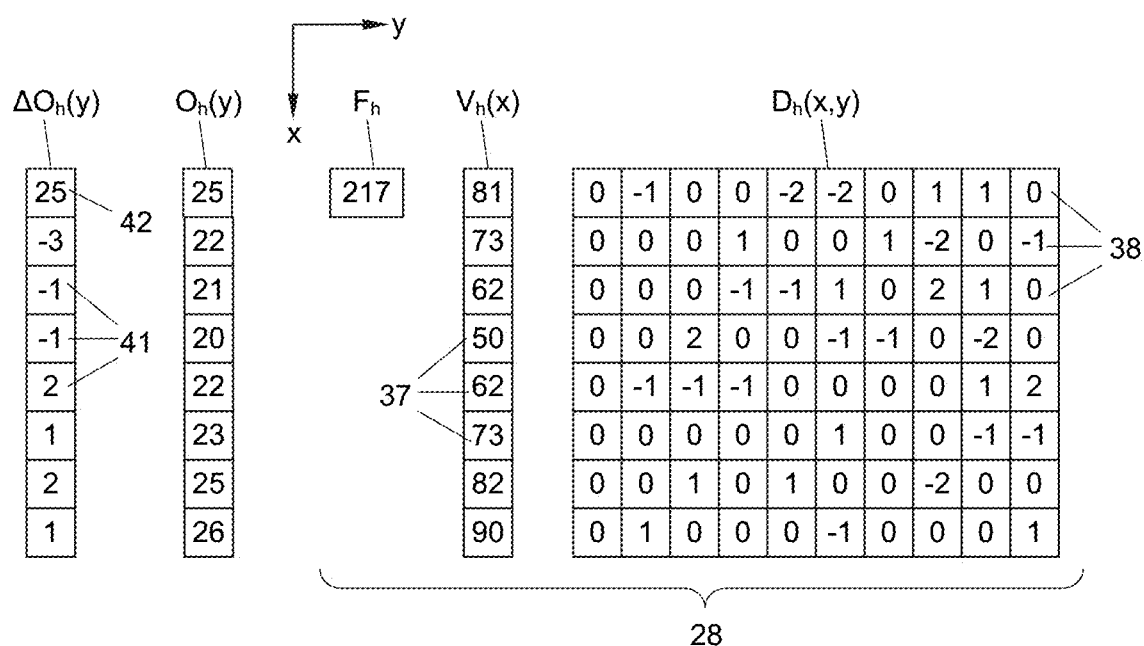
Figure 8:
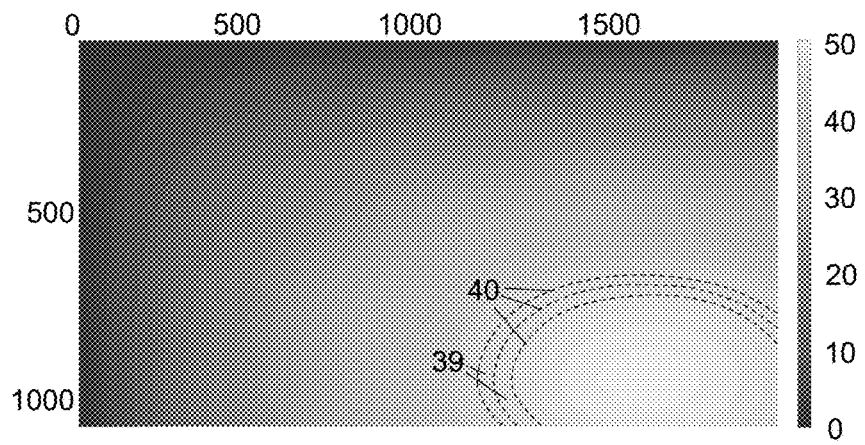
Figure 9:
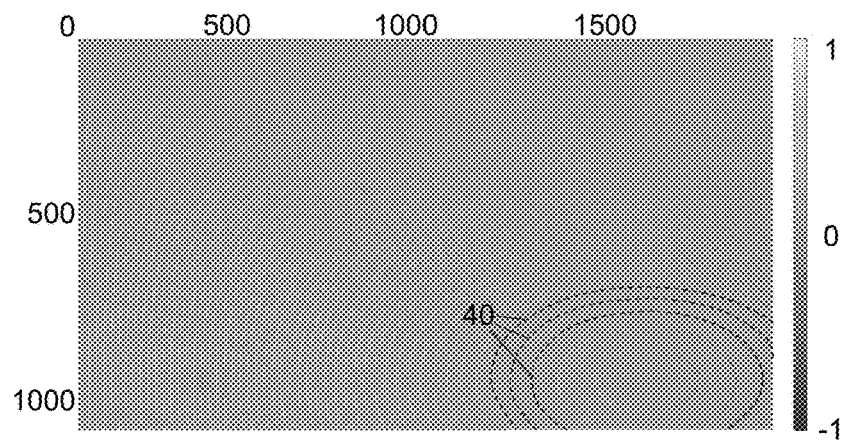
Figure 10:
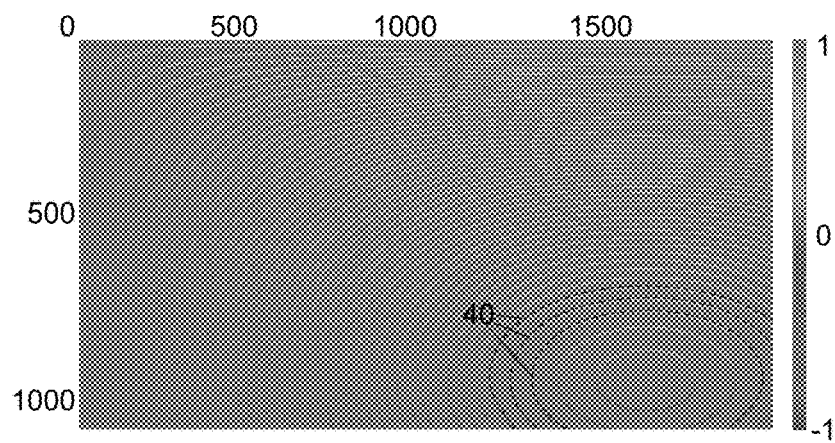

The disclosed subject matter shall now be explained in more detail below on the basis of exemplary embodiments thereof with reference to the accompanying drawings, in which show:

FIG. 1 a projector according to the disclosed subject matter in the process of projecting an image onto a screen in a perspective view;

FIG. 2 a plot of the intensity of emission of the projector of FIG. 1 as a function of time;

FIG. 3 a plot of the angular position of the MEMS mirror of the projector of FIG. 1 about the horizontal axis as a function of time;

FIG. 4 the projector of FIG. 1 in a schematic circuit diagram;

FIG. 5a a decomposition of a playout matrix to be retrieved by the processor of the projector of FIGS. 1 and 4 in a three-dimensional plot (here only its horizontal durations are shown, its vertical durations being decomposed similarly);

FIG. 5b a numerical example of the decomposition of the playout matrix of FIGS. 1 and 4, given for its horizontal durations;

FIG. 6 a numerical example of an alternative decomposition of the playout matrix of FIGS. 1 and 4, given for its horizontal durations;

FIG. 7 a numerical example of a further decomposition of the playout matrix of FIGS. 1 and 4, given for its horizontal durations;

FIG. 8 the playout matrix of FIGS. 1 and 4 in a two-dimensional plot with greyscale coding of the horizontal durations;

FIG. 9 a horizontal derivative of the playout matrix of FIG. 8 in a two-dimensional plot with greyscale coding of the derivatives of the horizontal durations; and FIG. 10 a vertical derivative of the playout matrix of FIG. 9 in a two-dimensional plot with greyscale coding of the vertical durations.

DETAILED DESCRIPTION

FIG. 1 shows a projector 1 emitting a beam 2 of light pulses $3_i$ (i=0, 1, 2, ...) to project an image 4 onto a wall 5. The image 4 may be a single image, e.g., a photo to be projected for a longer period of time, or be part of a movie M. Instead of a wall 5, the projector 1 could also emit the beam 2 of light pulses $3_i$ onto any kind of surface, such as a board, projection screen, poster, the retina of an eye, an Augmented-Reality (AR) combiner waveguide, another combiner optics or the like.

With reference to FIGS. 1 and 4, the projector 1 has a light source 6 for emitting the beam 2 and a micro-electromechanical system, MEMS, mirror 7 for deflecting the emitted beam 2 towards the wall 5. The MEMS mirror 7 oscillates about a horizontal axis 8 with a horizontal oscillation period $T_h$ and about a vertical axis 9 with a vertical oscillation period $T_v$ to scan the emitted beam 2 over a projection area 10 on the wall 5 along a trajectory 11.

The light source 6 may be any light source known in the art, e.g., an incandescent lamp, a gas, liquid or solid laser, a laser diode, an LED, etc. The MEMS mirror 7 may either comprise one reflective surface 12 oscillating about the horizontal and vertical axes 8, 9 or two reflective surfaces 12, one after the other in the optical path of the light beam 2, each of which surfaces 12 then oscillating about one of the horizontal and vertical axes 8, 9.

In the embodiment shown in FIG. 1, the horizontal oscillation period $T_h$ is much shorter than the vertical oscillation period $T_v$, and hence the projection area 10 is scanned by the light beam 2 in substantially horizontal meander lines ("line by line") along the trajectory 11. Alternatively, $T_h$ may be much longer than $T_v$ to scan the projection area 10 with a trajectory 11 of substantially vertical meander lines. In general, $T_h$ and $T_v$ may be chosen arbitrarily, resulting in a scanning of the projection area 10 by a Lissajous curve.

The projection area 10 is geometrically distorted due to the orientation of the projector 1 with respect to the wall 5, a possible curvature of the wall 5, and any intrinsic interdependencies of the oscillations of the MEMS mirror 7 about the horizontal and vertical axes 8, 9. Furthermore, in an uncompensated case (not shown), the non-linear oscillation movement of the MEMS mirror 7 leads to an unequal spatial distribution of periodically emitted light pulses $3_i$ on the projection area 10. More light pulses $3_i$ are emitted closer to a boundary 13 of the projection area 10 than at its centre 14. Besides a geometrical distortion, this causes an uneven brightness of the projection area 10.

The projector 1 compensates for these distortions and uneven brightness by controlling the timing of the light pulses $3_i$ so that they are projected in an image area 15 within the projection area 10 in an equidistant grid 16 of cells 17, one light pulse $3_i$ per cell 17 and one cell 17 per pixel $P_{x,y}$ of the image 4, as best as possible.

FIG. 2 shows a sequence or train S of light pulses $3_i$ within the light beam 2 as light pulse intensities I over time t, and FIG. 3 shows the train S of light pulses $3_i$ with respect to the horizontal angular position $\varphi_h$ of the MEMS mirror 7 over time t. Each light pulse $3_i$ is emitted at a respective time t, with a pulse width pw and a respective intensity $I_i$ to project a pixel $P_{x,y}$ onto the corresponding cell 17 of the grid 16. The intensity $I_i$ of each pixel $P_{x,y}$ and hence light pulse $3_i$ is provided in the image 4. The times $t_i$, and in particular the time intervals $\Delta t_i$ between each two subsequent light pulses $3_i$, $3_{i+1}$, are calculated to yield a substantially equidistant projection of the pixels $P_{x,y}$ in the image area 15 as described later.

When the trajectory 11 reaches a boundary 18 of the image area 15 a longer time interval $\Delta t_{i+1}$ lapses between the light pulse $3_{i+1}$ and the light pulse $3_{i+2}$ respectively corresponding to pixel $P_{4,1}$ and pixel $P_{5,1}$ (FIG. 1). The time intervals $\Delta t_i$ could principally be chosen such that the image area 15 is the largest rectangular region fitting in the projection area 10. In the variant shown in FIG. 3 only a quasi-linear regime $t_a$ of the oscillation period $T_h$ and $T_v$ is used to project the light pulses $3_i$. Hence, the boundary 18 of the image area 15 and the boundary 13 of the projection area 10 are in a horizontal offset 19 and a vertical offset 20, each depending on the position in the projection area 10.

The pulse width pw is equal for all pulses $3_i$ in the train S of FIG. 2 to reach a unique brightness throughout the equidistant grid 16. The pulse width pw may be chosen as long as possible to maximise the brightness of the projected image, however, must not exceed the minimal expected time interval $\Delta t_i$ between two subsequent pulses $3_i$, $3_{i+1}$. Alternatively, different pulse widths pw may be applied for different pulses $3_i$, e.g., to correct for an uneven absorption of the wall 5.

As shown in FIG. 4, the projector 1 has a microprocessor MP which is connected to a memory 21 where the image 4 to be projected is stored as a matrix 22 of intensities I(x,y) for the pixels $P_{x,y}$. The microprocessor MP determines in blocks 23 and 24 for each light pulse $3_i$ in the train S a horizontal pixel index x and a vertical pixel index y corresponding to the current angular horizontal position $\varphi_h$ and angular vertical position $\varphi_v$ of the MEMS mirror 7 and hence the current position of the light beam 2 along the trajectory 11 over the projection area 10, as will be explained later in detail.

On the one hand, the pixel indices x, y are used to retrieve the respective intensities I(x,y) of the pixels $P_{x,y}$ from the memory 21 and to apply them as intensities $I_i$ to the pulses $3_i$. The pulses $3_i$ are generated on the basis of a system clock 25 by a pulse generator 26 in individual time intervals $\Delta t_i$, modulated with their intensities $I_i$ in a modulator 27 and sent out via the light source 6 in the light beam 2 carrying the pulse train S.

On the other hand, the pixel indices x, y determined by the microprocessor MP are used to retrieve respective horizontal and vertical pixel durations $d_h(x,y)$, $d_v(x,y)$ from a "playout"

matrix 28 in a memory 29 and to calculate the time intervals $\Delta t_i$ for the pulse generator 26 therefrom in blocks 30, 31 and 32 as explained below.

For performing these tasks, the microprocessor MP and in particular each of the blocks 23-27, 30-32 may be either implemented in software, e.g., as a function, an object, a class, etc., or in hardware, e.g., as an integrated circuit element, as an area in an ASIC, FPGA, etc., or as a mixture of hard and software elements.

The horizontal and vertical durations $d_h(x,y)$, $d_v(x,y)$ in the playout matrix 28 each represent a time span within the respective mirror oscillation period $T_h$, $T_v$ in which time span the trajectory 11 would traverse a whole width w or height h, respectively, of a region 33 assigned to that pixel $P_{x,y}$ in the projection area 10.

As shown in FIG. 1, for each inner, i.e., "non-boundary" pixel $P_{x,y}$ of the grid 16, the region 33 simply is the corresponding cell 17 of the grid 16. For each pixel $P_{x,y}$ at the boundary 18 of the grid 16, i.e., for pixels $P_{x,y}$ in the first or last rows $r_f$, $r_l$ or columns $c_f$, $c_l$ of the grid 16, the region 33 includes, in addition to the corresponding cell 17, also the adjacent horizontal offset 19, or vertical offset 20, respectively, of the image area 15 to the projection area 10, as exemplarily shown for the bottom left corner pixel $P_{13,1}$. For an equidistant grid 16 the durations $d_h$, $d_v$ for inner pixels $P_{x,y}$ thus represent the reciprocal values of the local horizontal and vertical angular velocities of the MEMS mirror 7, and for boundary pixels $P_{x,y}$ they additionally indicate a measure of the respective offset 19, 20.

One practical possibility to fill the playout matrix 28 with appropriate values so that an equidistant grid with one light pulse $3_i$ per grid cell 17 is obtained is to analytically determine the optical path of the light pulses $3_i$ as a function of time t based on the mirror parameters and calculate the respective durations $d_h$, $d_v$ for each pixel $P_{x,y}$. Another possibility is to measure the trajectory 11 and distribution of periodically emitted light pulses $3_i$ on the projection area 10, e.g., by means of a camera, and then calculate corresponding durations $d_h$, $d_v$ therefrom for an equidistant, undistorted projection. Whenever the mirror parameters change significantly, e.g., due to aging or for different ambient temperatures, a different playout matrix 28 may be provided, either analytically, pre-calculated or calculated on the basis of new calibration measurements.

The horizontal and vertical durations $d_h$, $d_v$ may be contained in the playout matrix 28 as shown in FIG. 4, i.e., as two matrices each holding the respective horizontal or vertical durations $d_h$, $d_v$, or as a single matrix holding doublets, each of a horizontal and a vertical duration $d_h$, $d_v$.

The pixel indices x, y corresponding to the current position of the light beam 2 on the projection area 11 are determined iteratively by blocks 23, 24 as follows. Basically, the indices x and y are determined independently of each other, i.e., index x in block 23 and index y in block 24.

The pixel index determination processes in blocks 23, 24 are synchronized to the respective oscillations of the MEMS mirror 7 about the horizontal and vertical axes 8, 9. To this end, block 23 for determining the pixel index x periodically receives a synchronisation signal x_sync from a drive 34 of the MEMS mirror 7. The synchronisation signal x_sync resets the pixel index x to a predetermined starting point, e.g., to x=1 when the light beam 2 is at one of the left turning points $11_1$ of the trajectory 11 corresponding to the minima of the curve depicted in FIG. 3. Or, the synchronisation signal x_sync could be output by the drive 34 at every zero crossing of the curve of FIG. 3 which corresponds to a pixel in the centre column of the grid 16, and the pixel index x would then be reset to the x index of the centre column.

It should be noted that it is not necessary to have a synchronisation signal x_sync once or twice every horizontal oscillation period $T_h$. Only one synchronization signal x_sync could be received every second, third, fourth etc. oscillation period $T_h$. As the pixel index x will be incremented and decremented on the basis of accumulating the horizontal durations $d_h$ retrieved from the playout matrix 28 as explained below, the synchronization signal x_sync is used just for resynchronizing the x pixel determination process from time to time to counteract the accumulation of possible errors of inaccuracies of the durations $d_h$.

Similarly, block 24 for determining the pixel index y receives a synchronization signal y_sync from the drive 34 of the MEMS mirror 7 indicative of a predetermined time within each vertical oscillation period $T_v$ to reset the pixel index y to a predetermined starting point, e.g. y=1, for resynchronizing the y pixel determination to the vertical mirror oscillation from time to time.

In each iteration in blocks 23, 24 first the durations $d_v(x,y)$ and $d_h(x,y)$ stored for the current pixel $P_{x,y}$ indexed by the current pixel indices x, y are retrieved from the playout matrix 28. Since the playout matrix 28 is stored in the memory 29 in a very specific way as will be explained further down in detail, during said retrieving blocks 30, 31 reconstruct the playout matrix 28 from the memory 29 and output the respective durations $d_h$, $d_v$ indexed by the current pixel indices x, y to blocks 23 and 24 via paths 35, respectively.

Then, in block 23 (the analogous step in block 24 is described later), when such a new horizontal duration $d_h(x, y)$ is received, a timer monitors the lapse of the horizontal duration $d_h(x,y)$, e.g., by counting the system time t received from the system clock 25. When the horizontal duration $d_h(x,y)$ has lapsed, the horizontal pixel index x is incremented and the next iteration begins, i.e., block 23 starts anew with retrieving the next horizontal duration $d_h(x,y)$.

The pixel index x is thus incremented iteratively in block 23 until it has reached either the maximum pixel index of the grid 16 or half of the oscillation period $T_h$ has lapsed. In the following iterations, the pixel index x is then decremented until it has either returned to its starting value x=1 or another half of the oscillation period $T_h$ has lapsed. Hence, in both cases the pixel index x is incremented for the first half and decremented for the second half of every horizontal oscillation period $T_h$.

In block 24 analogous iterations steps are performed for the pixel index y. The pixel index y is incremented for the first half and decremented for the second half of the vertical oscillation period $T_v$ whenever the current vertical duration $d_v(x,y)$ retrieved from the playout matrix 28 lapses.

While the blocks 23 and 24 determine the respective current pixel indices x, y, each time one of the pixel indices x, y changes a "new" pixel $P_{x,y}$ indexed by the newly changed pixel indices x, y is "played out", i.e., a new light pulse $3_{i+1}$ is sent following the current light pulse $3_i$. The time interval $\Delta_i$ which is to be waited before the new light pulse $3_{i+1}$ in the train S is sent is calculated in block 32 as a function $f(d_h,d_v)$ of the horizontal and vertical durations $d_h$, $d_v$, more precisely, of those durations $d_h$, $d_v$ that have just been retrieved under the current pixel indices x, y from the playout matrix 28, see paths 36. Therefore, when sending out the train S of light pulses $3_i$ the intensity $I_i(x,y)$ to be applied to a light pulse $3_i$ by the modulator 27 for a pixel $P_{x,y}$ is retrieved from the matrix 22 in the memory 21 under the current pixel indices x, y, and the waiting interval $\Delta t_i$ for sending a respective subsequent light pulse $3_{i+1}$ is calculated in block 32 as a function of the horizontal and vertical durations $d_h(x,y)$, $d_v(x,y)$ retrieved from the playout matrix 28 in the memory 29.

The block 32 may calculate the time interval $\Delta_i$ in many ways. In the embodiment of FIG. 1 with a $T_v \gg T_h$, the interval $\Delta t_i$ between two light pulses $3_i$, $3_{i+1}$ may be calculated by taking only the horizontal duration $d_h$ (minus the pulse width pw), i.e., $\Delta t_i(x,y)=d_h(x,y)-pw$.

In the reversed case of $T_h \gg T_v$, the interval $\Delta t_i$ may analogously be calculated by considering only the vertical duration $d_v$ (minus the pulse width pw), i.e., $\Delta t_i(x,y)=d_v(x,y)-pw$. In an intermediate case any combination of the horizontal and vertical durations $d_h$, $d_v$ may be taken, e.g., $\Delta t_i = \min(d_h, d_v)-pw$.

For all the above processes, a fast retrieval of the durations $d_h$, $d_v$ from the playout matrix 28 is fundamental. To this end, a fast physical memory is used for the memory 29 such as an on board or internal memory of the processor MP. However, such onboard or internal processor memory is usually limited in space which would put a limit on the maximal resolution of the image 4 to project.

FIGS. 5a and 5b illustrate a memory saving way of storing the playout matrix 28 in the second memory 29 so that a fast physical memory can be used. FIG. 5a shows only the horizontal durations $d_h(x,y)$ stored in the playout matrix 28 and their values depending on the pixel indices x, y and FIG. 5b a numerical exemplary decomposition of the horizontal durations $d_h(x,y)$. The same applies mutatis mutandis to the vertical durations $d_v(x,y)$ stored in the playout matrix 28, such that the following decomposition and variants thereof can be performed therefor analogously.

The horizontal durations $d_h$ can be decomposed into a floor value $F_h$ common to all elements of the playout matrix 28, a residual vector $V_h(y)$ comprised of a "first" residual value 37 for each column $c_i$ i.e., which is common to all rows $r_i$ of the playout matrix 28, and a residual matrix $M_h(x,y)$ comprised of "second" residual values 38.

Analogously, the vertical durations $d_v$ can be decomposed into a floor value $F_v$ common to all elements of the playout matrix 28, a residual vector $V_v(y)$ comprised of a "first" residual value 37 for each column $c_i$ i.e., which is common to all rows $r_i$ of the playout matrix 28, and a residual matrix $M_v(x,y)$ comprised of "second" residual values 38. For ease of understanding, the decomposition of the playout matrix 28 is described with reference to its horizontal floor value $F_h$, residual vector $V_h$ and matrix $M_h$ in the following. However, it goes without saying that the same applies mutatis mutandis to its vertical floor value $F_v$, residual vector $V_v$ and matrix $M_v$.

The second residual values 38 represent the difference between the respective sum of floor and first residual value $F_h$, 37 and the respective duration $d_h(x,y)$. This difference has a smaller magnitude than the duration $d_h(x,y)$, and each second residual value 38 can thus be stored in the second memory 29 with a shorter bit length, e.g., with four bits when the floor and first residual values $F_h$, 37 have a bit length of eight.

Coming back to FIG. 4, the horizontal durations $d_h$ are retrieved from the second memory 29 by means of the retrieving block 30. The retrieving block 30 reconstructs each horizontal duration $d_h$ by combining, in this case adding, the respective floor, first and second residual value $F_h$, 37, 38 from the residual vector $V_h(y)$ and residual matrix $M_h(x,y)$ indexed by the current horizontal and vertical pixel indices x, y. Analogously, the retrieving block 30 retrieves the vertical durations $d_v$ by combining the floor and the respective first and second residual values $F_v$, 37 and 38 from the vertical residual vector $V_v(x)$ and residual matrix $M_v(x,y)$.

Depending on the applied decomposition, the reconstruction may involve another combination, e.g., an appropriate non-linear decomposition (not shown) could be reconstructed by multiplying the floor $F_h$ and the respective first residual value 37 and adding/multiplying the second residual value 38, etc.

The dynamics of the playout matrix 28 determine the memory savings achieved by the decomposition and, hence, should be taken into account when choosing the appropriate decomposition. In the example shown in FIG. 5a the durations $d_h(x,y)$ exhibited a large horizontal dynamics with mostly similar values in x-direction, i.e., for each column $c_i$ of the playout matrix 28. FIG. 6 shows an alternative decomposition of the playout matrix 28 when the durations $d_h(x,y)$ exhibit a large vertical dynamics with mostly similar values in y-direction. Here, the first residual vector $V_h(x)$ may be used to contain residual values 37 common to all columns $c_i$ of the playout matrix 28.

In some applications, only a horizontal calibration of the image 4 to project may be sufficient. Hence, the horizontal durations $d_v$ may be fully decomposed into floor, first and second residual values $F_h$, 37, 38 while the vertical durations $d_v$ are decomposed into a constant matrix, e.g., stored only as a floor value $F_v$. Alternatively, a full horizontal and a partial vertical calibration can be performed by decomposing the horizontal durations $d_v$ into floor, first and second residual values $F_h$, 37, 38 while the vertical durations $d_v$ are decomposed into a matrix with constant rows or columns, e.g., being stored only as a floor value $F_v$ and a residual vector $V_v$. Of course, in all these examples the terms "horizontal" and "vertical" may be interchanged.

Because of the horizontal and/or vertical offsets 19, 20, the durations $d_h$ in the first and last columns $c_f$, $c_l$ or and/or rows $r_f$, $c_l$ of the playout matrix 28 are significantly larger than in the rest of the playout matrix 28, which increases the dynamics of the playout matrix 28. To mitigate this problem, in a further variant shown in FIG. 7 a part of each of the horizontal durations $d_h$ in the first and last columns $c_f$, $c_l$ of the playout matrix 28 may be stored, instead of in the playout matrix 28, in a horizontal offset vector $O_h$. The respective elements of this offset vector $O_h$ are then also retrieved by the block 30 to reconstruct the durations $d_h$.

Alternatively, instead of one horizontal offset vector $O_h$ two horizontal offset vectors $O_{h,f}$, $O_{h,l}$ can be used, one to store a part of the horizontal durations $d_h$ of the first column $c_f$ and the other to store a part of the horizontal durations $d_h$ of the last column $c_l$.

Analogously, vertical durations $d_v$ in the first and last rows $r_f$, $r_l$ of the playout matrix 28 can be stored in a vertical offset vector $O_v$ and retrieved therefrom by block 31. Also here two vertical offset vectors $O_{v,f}$, $O_{v,l}$ can be used, one to store a part of the vertical durations $d_v$ of the first row $r_f$ and the other to store a part of the vertical durations $d_v$ of the last row $r_l$.

A further memory reduction can be achieved by using an incremental storage scheme for the first and second residual values 37, 38 and/or the offset vectors $O_h$, $O_v$. As can be seen from FIGS. 8-10, the playout matrix 28 (here shown for the horizontal durations $d_h$) has, due to a discrete resolution of storage, regions 39 of similar values which change in steps at region borders 40.

This property of the playout matrix 28 can be exploited by storing the respective elements incrementally. The left side of FIG. 7 shows a variant of storing the offset vector $O_h$ in form of a vector $\Delta O_h$ whose elements 41 are each stored as an increment with respect to a neighbouring element, one element 42 being stored as an absolute value. Only this element 42 is stored with a longer bit length than the other elements 41. Similarly, the right side of FIG. 7 shows the residual matrix $M_h$ with every residual value 38 being stored as an increment with respect to its neighbour (except for one absolute value). Optionally, also the first residual values 37 in the vectors $V_h$, $V_v$ may be stored incrementally.

When an incremental storage scheme is used, instead of signs of the increments only the positions of sign changes of the increments can be stored. The magnitudes of the increments can then be combined with the signs separately retrieved. In the example of FIGS. 8-10, the increments can then be stored using one single bit.

Up to now, the x- and y-dimensions of the pixel matrix 22 and the playout matrix 28 were equal. In an alternative embodiment the playout matrix 28 can be stored in the second memory 29 in a lower pixel resolution than the pixel matrix 22 and be oversampled to the resolution of the pixel matrix 22 when indexing a horizontal or vertical duration $d_h$, $d_v$. The lower resolution may, e.g., be obtained by averaging neighbouring durations $d_h$, $d_v$ or exploiting a symmetry of the playout matrix 28.

As an example, consider a centred projection on a planar wall 5, where the playout matrix 28 has a horizontal and a vertical symmetry and may be stored using only a quarter of the memory compared to an asymmetric case. When present, an offset vector $O_h$, $O_v$ may also be stored in a memory saving format by exploiting a symmetry.

So far, the image 4 was represented by one single intensity $I_i$ per pixel $P_{x,y}$ allowing only for a monochromatic, grey-scale or black and white projection. In many applications a colour image 4 represented as a matrix 22 of pixels $P_{x,y}$ with individual intensities $I_i$ for each of two or more colours, e.g., RGB or YCbCr, etc., is to be projected. In this case, the light source 6 comprises for each of the colours a laser emitting a respective train S of monochromatic light pulses $3_i$ with variable intensities $I_i$ and intervals $\Delta t_i$ and the MEMS mirror 7 deflects all of the emitted light pulses $3_i$. The retrieval of the durations $d_h$, $d_v$ and intensities $I_i$ and the calculation of intervals $\Delta t_i$ is then performed by providing the blocks 23, 24, 30, 31, 32, the pulse generator 26 and the modulator 27 for each colour. The image area 15 may, e.g., be chosen the largest rectangular area of overlap of the respective projection areas 10 of all colours with overlapping grids 16.

The disclosed subject matter is not restricted to the specific embodiments described above but encompasses all variants, modifications and combinations thereof that fall within the scope of the appended claims.

What is claimed is:

1. A method of projecting an image provided as a matrix of pixels with intensities onto a projection area by means of a light source emitting a train of light pulses with variable intensities and intervals and a micro-electro-mechanical system, MEMS, mirror oscillating about a horizontal axis with a horizontal oscillation period and about a vertical axis with a vertical oscillation period and deflecting the emitted light pulses, the method comprising:

providing a playout matrix of a horizontal and a vertical duration for each pixel, and for a first half of every horizontal oscillation period, incrementing, and for a second half of every horizontal oscillation period, decrementing a horizontal pixel index whenever one of the horizontal durations indexed by the current horizontal pixel index in the playout matrix has lapsed;

for a first half of every vertical oscillation period, incrementing, and for a second half of every vertical oscillation period, decrementing a vertical pixel index whenever one of the vertical durations indexed by the current vertical pixel index in the playout matrix has lapsed;

for each light pulse in the train:

retrieving the respective intensity from the pixel matrix indexed by the current horizontal and vertical pixel indices, retrieving the respective horizontal and vertical durations from the playout matrix indexed by the current horizontal and vertical pixel indices, calculating an interval from at least one of said respective horizontal and vertical durations, emitting said light pulse with said retrieved intensity, and waiting said calculated interval before emitting the next light pulse in the train.

2. The method according to claim 1, wherein the playout matrix is decomposed into a pair of floor values common to all elements of the playout matrix, a residual vector comprised of first residual values for horizontal and/or vertical durations common to all rows or columns of the playout matrix, and a residual matrix comprised of second residual values for horizontal and/or vertical durations, wherein each second residual value is provided with a shorter bit length than the floor or first residual values, and that said retrieving of the respective horizontal and vertical durations is made by combining the floor values with the respective first and second residual values indexed by the current horizontal and vertical pixel indices.

3. The method according to claim 2, wherein at least a part of the horizontal durations in the first and last columns of the playout matrix is provided, instead of in the playout matrix, in at least one horizontal offset vector which is used in calculating the intervals for the pixels in said first and last columns.

4. The method according to claim 2, wherein at least a part of the vertical durations in the first and last rows of the playout matrix is provided, instead of in the playout matrix, in at least one vertical offset vector which is used in calculating the intervals for the pixels in said first and last rows.

5. The method according to claim 2, wherein each first residual value is stored as an increment with respect to a neighbouring first residual value in the residual vector.

6. The method according to claim 2, wherein each second residual value is stored as an increment with respect to a neighbouring second residual value in the residual matrix.

7. The method according to claim 1, wherein the horizontal pixel index is incremented, or decremented, respectively, whenever the horizontal duration indexed by the current horizontal and vertical pixel indices in the playout matrix has lapsed, and that the vertical pixel index is incremented, or decremented, respectively, whenever the vertical duration indexed by the current horizontal and vertical pixel indices in the playout matrix has lapsed.

8. The method according to claim 1, wherein the playout matrix is stored in a lower pixel resolution than the pixel matrix and, when indexing a horizontal or vertical duration, is oversampled to the resolution of the pixel matrix.

9. The method according to claim 1, wherein the playout matrix is stored in a memory saving format by exploiting a symmetry of the playout matrix.

10. The method according to claim 1, wherein the image is provided as matrix of pixels with intensities for two or more colours,
the light source comprises for each of said colours a laser emitting a train of light pulses of the respective colour with variable intensities and intervals and
the MEMS mirror deflects the emitted light pulses of each of said colours,
wherein the steps of providing, incrementing, retrieving, calculating, emitting and waiting are performed separately for each of said colours.

11. A projector, comprising
a first memory for providing an image as a matrix of pixels with intensities,
a light source configured to emit a train of light pulses with variable intensities and intervals,
a micro-electro-mechanical system, MEMS, mirror configured to oscillate about a horizontal axis with a horizontal oscillation period and about a vertical axis with a vertical oscillation period and to deflect the emitted light pulses onto a projection area,
a second memory containing a playout matrix of a horizontal and a vertical duration for each pixel, and
a processor connected to the first memory, the light source, the MEMS mirror, and the second memory,
wherein the processor is configured to
for a first half of every horizontal oscillation period, increment, and for a second half of every horizontal oscillation period, decrement a horizontal pixel index whenever one of the horizontal durations indexed by the current horizontal pixel index in the playout matrix has lapsed;
for a first half of every vertical oscillation period, increment, and for a second half of every vertical oscillation period, decrement a vertical pixel index whenever one of the vertical durations indexed by the current vertical pixel index in the playout matrix has lapsed, and
for each light pulse in the train:
retrieve the respective intensity from the pixel matrix indexed by the current horizontal and vertical pixel indices,
retrieve the respective horizontal and vertical durations from the playout matrix indexed by the current horizontal and vertical pixel indices,
calculate an interval from at least one of said respective horizontal and vertical durations,
emitting said light pulse via the light source with said retrieved intensity, and
wait said calculated interval before emitting the next light pulse in the train.

12. The projector according to claim 11, wherein the playout matrix in the second memory is decomposed into a pair of floor values common to all elements of the playout matrix, a residual vector comprised of first residual values for horizontal and/or vertical durations common to all rows or columns of the playout matrix, and a residual matrix comprised of second residual values for horizontal and/or vertical durations, wherein each second residual value is provided with a shorter bit length than the floor or first residual values, and
that the processor is configured to retrieve the respective horizontal and vertical durations by combining the floor values with the respective first and second residual values indexed by the current horizontal and vertical pixel indices.

13. The projector according to claim 12, wherein at least a part of the horizontal durations in the first and last columns of the playout matrix is stored in the second memory, instead of in the playout matrix, in at least one horizontal offset vector which is used in calculating the intervals for the pixels in said first and last columns, and/or
that at least a part of the vertical durations in the first and last rows of the playout matrix is stored in the second memory, instead of in the playout matrix, in at least one vertical offset vector which is used in calculating the intervals for the pixels in said first and last rows.

14. The projector according to claim 11, wherein the playout matrix is stored in the second memory in a lower pixel resolution than the pixel matrix in the first memory and that the processor is configured to oversample the playout matrix to the resolution of the pixel matrix when indexing a horizontal or vertical duration.

15. The projector according to claim 11, wherein the image is providable in the first memory as a matrix of pixels with intensities for two or more colours,
that the light source comprises for each of said colours a laser for emitting a respective train of light pulses of the respective colour with variable intensities and intervals, and
that the MEMS mirror is configured to deflect the emitted light pulses of each of said colours,
wherein the processor is configured to perform the steps of providing, incrementing, retrieving, calculating, emitting and waiting separately for each of said colours.

16. The projector according to claim 15, wherein the image is providable in the first memory as a matrix of pixels with intensities for the three colours red, green and blue.

* * * * *